(12) United States Patent
Mor et al.

(10) Patent No.: US 6,873,154 B2
(45) Date of Patent: Mar. 29, 2005

(54) ALGORITHMIC COOLING

(76) Inventors: Tal Mor, 28a Yizrael Street, Qiryat Tivon (IL), 36032; Vwani Roychowdhury, 2630 Lakewood Ave., Los Angeles, CA (US) 90039; Seth Lloyd, 9 Weston Ter., Wellesley, MA (US) 02482; Jose Manuel Fernandez, 2211-12 E'douard-Monpetit, Montreal, Quebec (CA), H3T 1J3; Yossi Weinstein, 4 Freiberg Street, Haifa (IL), 32447

( * ) Notice: Subject to any disclaimer, the term of this patent is extended or adjusted under 35 U.S.C. 154(b) by 0 days.

(21) Appl. No.: 10/462,580

(22) Filed: Jun. 16, 2003

(65) Prior Publication Data

US 2004/0051528 A1 Mar. 18, 2004

Related U.S. Application Data

(60) Provisional application No. 60/389,208, filed on Jun. 17, 2002.

(51) Int. Cl.[7] .................................................. G01V 3/00
(52) U.S. Cl. ........................................ 324/315; 324/300
(58) Field of Search ................................ 324/315, 300, 324/306, 307, 309, 312

(56) References Cited

U.S. PATENT DOCUMENTS

| | | | | |
|---|---|---|---|---|
| 5,345,174 A | * | 9/1994 | Kimmich et al. | 324/309 |
| 5,917,322 A | * | 6/1999 | Gershenfeld et al. | 324/307 |
| 6,005,390 A | * | 12/1999 | Watanabe et al. | 324/307 |

* cited by examiner

*Primary Examiner*—Louis Arana
(74) *Attorney, Agent, or Firm*—William H. Dippert; Reed Smith LLP (57) ABSTRACT

A method for decreasing entropy of a quantum system, for example nuclear spins. The quantum system comprising at least two subsystems, a first subsystem of elements with a first relaxation time (hereinafter—computation elements) and a second subsystem of elements with a second relaxation time (hereinafter—reset elements), the second relaxation time being shorter than the first relaxation time. The method comprises adiabatically decreasing the entropy of the computation elements in the system (by entropy compression, entropy transfer, or both) and increasing the entropy of at least some reset elements, so that the entropy of the subgroup of reset elements is overall increased; and waiting for the total entropy of the subgroup of reset elements to decrease, wherein the above two steps are carried out at least once.

14 Claims, 5 Drawing Sheets

ALGORITHMIC COOLING

This application claims the priority benefit of U.S. provisional patent application Ser. No. 60/389,208, filed Jun. 17, 2002.

FIELD OF THE INVENTION

The present invention relates to cooling techniques. In particular it relates to cooling of quantum systems.

BACKGROUND OF THE INVENTION

When dealing with quantum systems comprising particles or any degrees of freedom having discrete or continuous quantum states (such as an ensemble of spins, but also for example, quantum dots, photons, electromagnetic coherent states, harmonic oscillators and other such systems), at finite temperature, often thermal or systematic noise come in the way.

For example in spectroscopy based on nuclear magnetic resonance (NMR) this noise severely limits the usages of NMR for identifying and characterizing materials. Cooling techniques can then be used to reduce the noise, and therefore to improve the usefulness of the NMR technique.

NMR is a technique for studying nuclear spins in magnetic fields. NMR spectroscopy techniques (and similar techniques, e.g., quadrupole resonance) are extremely useful in identifying chemical materials (even identifying negligible amounts of them). There are numerous NMR applications in biology, medicine, chemistry, and physics, for instance identifying malfunctions of various body organs, identifying materials for police and army usages, monitoring brain activities, monitoring the purity of materials, and much more.

The signal to noise ratio is an important factor in NMR usages and techniques. The problem is that when the signal is not sufficiently clear or the noise is too strong, there would be difficulties in identifying the materials. There are several potential solutions that can improve the signal, but each of them has its problems. Note that in this pretext we refer to spin-half nuclei for which there is a simple one to one correspondence between cooling a spin, increasing its polarization bias, and reducing its entropy.

The first four potential solutions are:
1) Cooling the system (this cools the spin as well, therefore increases its polarization bias, therefore also increases the signal). Limitation: Usually it is irrelevant because it affects the results of the test by modifying the inspected molecules (e.g., solidifying the material), or by destroying the sample (e.g., killing the patient).
2) Increasing the magnetic field. Limitation: A much too expensive solution.
3) Increasing the sample, Limitation: It is usually impossible due to machine's limitations, or sample limitations. This is since one needs to increase the sample's size by a factor of $M^2$ in order to improve the signal-to-noise ratio by a factor of M.
4) Collecting many results is a possible and most common solution. Limitation: In order to improve the signal-to-noise ratio by a factor of M, spectroscopy requires $M^2$ repetitions. Therefore it becomes too time consuming in many cases (causing, for instance, high costs). It is even impractical in many other cases due to evolutions of the sample during the spectroscopy (e.g. changes in concentration of a material in some body organ, such as lungs). This is true especially because of the long recovery time between measurements. Furthermore, the repetition solution is not so useful if the noise considered is not a Gaussian noise.

The next two potential solutions are ways for cooling the spins (increasing their polarization bias), without cooling the environment (the molecules). This can be called an "effective cooling" of the spins. Such cooling is as good as regular cooling of the system, because the cooled spins can be used for spectroscopy, as long as they have not relaxed back to their thermal equilibrium state.

5) Adiabatic polarization compression: This compression can be understood as a set of logical gates (CNOT, SWAP, CSWAP and NOT, to be explained hereinafter) operating on the spins, gates that are practically demonstrated in various labs worldwide. In adiabatic polarization compression polarization is modified such that some spins become more polarized and others become less polarized. Limitation: Shannon's bound (on entropy compression) limits adiabatic polarization compression, and to the best knowledge of the inventors of the present invention no practical application of this method exists.

6) Polarization transfer: If at a given temperature, the spins we want to use (in spectroscopy) are less polarized than other spins, then swapping polarizations with these highly polarized spins is useful, and is equivalent to cooling the spins we want to use. Limitation: The improvement is limited by the spin-polarization of the highly polarized spins. This technique, applied between nuclear spins on the same molecule (and in parallel on all molecules) is common in NMR spectroscopy, but does not provide an impressive polarization increase. Performing polarization swapping between spins on different molecules has the same limitations but opens interesting possibilities, for instance, the use of Xenon recently improved polarization by a factor of 10. Swapping with electrons is much more promising in theory, but is very far from being applicable, because machines that manipulate electron spins cannot be used in NMR spectroscopy. Still if it becomes practical one day, this shall yield an improvement by a factor of up to 1000 of the polarization.

These latter two techniques developed so far for "effective cooling", provide some improvement, but the new effective cooling of the present invention appears to be substantially more effective and efficient.

Considering NMR in terms of logic gates we gain a deep insight on the effective cooling processes. If we consider effective cooling in this matter we can use many strong tools of data compression. Both the adiabatic polarization compression and the polarization transfer are then considered as simple logical gates applied onto the spins (that are considered as binary digits, that is, bits). The present invention combines thermalization together with entropy manipulation techniques (adiabatic polarization compression and polarization transfer). Adding thermalization is the contribution of this current invention, because it allows the design of novel cooling techniques, the "algorithmic cooling", that is not limited by Shannon's bound. Algorithmic cooling can still be fully described via logical gates operating on bits. The main importance of our invention (and a short term application) is to improve signal to noise ratio in NMR, due to improving the polarization bias, that is, cooling some of the spins.

Since we are dealing with spins, which are quantum systems, one needs to use a more complicated language in order to fully describe the implementation in the NMR lab. In order to describe the implementation of algorithmic cooling in the NMR lab, one can use the conventional NMR terminology, but it is more convenient to use the language of quantum gates, which relate to quantum computers. NMR quantum computers are currently the most successful quantum computing devices. The tools developed in NMR quantum computing provide a better insight on how to perform algorithmic cooling in practice.

Furthermore, quantum computing appears to be very important, due to their ability to solve hard problems (and break very important cryptosystems). NMR quantum computers are a special type of quantum computers known as ensemble quantum computers. The widespread belief is that even though ensemble quantum computation is a powerful scheme for demonstrating fundamental quantum phenomena, it is not scalable. Luckily, however, it was shown recently, that the scaling problem does not exist if one uses adiabatic data compression schemes to initialize the quantum computer via polarization compression. Once enough qubits (say, m) are cooled to sufficiently low polarization bias $\epsilon_F$, the NMR quantum computer can then be used without any scalability problem. However, as mentioned before, that cooling method is limited due to the Shannon's bound on entropy manipulations.

The second (long-term) use of algorithmic cooling is to allow for scalable NMR quantum computing, which is not limited by Shannon's bound on entropy manipulation.

It is an object of the present invention to present the new cooling technique called algorithmic cooling. Algorithmic cooling combines thermalization with adiabatic data compression, or it combines thermalization with polarization transfer, this variant of algorithmic cooling is called "cooling by thermalization". The more general algorithmic cooling combines thermalization, polarization transfer, and adiabatic polarization compression. In general we obtain "polarization compression" that is not limited to be adiabatic anymore.

Another object of the present invention is to provide an algorithmic cooling of nuclear spins, which is practical and yields substantial cooling.

Yet another object of the present invention is allowing the application of this method in various NMR techniques (MRI, liquid and solid state NMR) Still another object of the present invention is to provide a most basic algorithmic cooling step that is already applicable to molecules as small as a molecule that contains 3 nuclei with spin ½. In particular, we show that all steps of algorithmic cooling were already implemented on such molecules, some steps on Tri-chloro-ethylene ($C_2Cl_3H$) and other steps on Tri-fluoro-bromo-ethylene ($C_2F_3Br$).

Another object of the present invention is to present the usefulness of increasing the ratio of thermalization times of different nuclei, for allowing warm spins to cool down while preventing cool spins from warming up. In particular, we show one way of doing that, via the use of the magnetic salt Chromium Acetylacetonate.

Another object of the present invention is to suggest scalable NMR quantum computation initialized by algorithmic cooling as a long-term application.

Other aspects and advantages of the present invention are described hereinafter and will become apparent after reading the present specification and viewing the accompanying figures.

BRIEF DESCRIPTION OF THE INVENTION

There is thus provided, in accordance with a preferred embodiment of the present invention, a method for decreasing entropy of a quantum system of at least two subsystems, a first subsystem comprising elements with a first relaxation time (hereinafter—computation elements) and a second subsystem comprising elements with a second relaxation time (hereinafter—reset elements), the second relaxation time being shorter than the first relaxation time, characterized by a relaxation time ratio defined as the ratio between the relaxation time of the computation elements and the relaxation time of the reset elements, the method comprising:

adiabatically manipulating the entropy of the elements in the system, by way of entropy compression, entropy transfer or both, so as to decrease the entropy of at least some computation elements, and to increase the entropy of at least some reset elements, so that the entropy of the subgroup of reset elements is overall increased;

waiting for a time sufficiently longer than the relaxation time of the reset elements, and sufficiently shorter than the relaxation time of the computation elements for the total entropy of the subgroup of reset elements to decrease;

adiabatically manipulating the entropy of predetermined elements in the system, by way of entropy compression, entropy transfer or both, so as to decrease the entropy of at least some predetermined computation elements, and to increase the entropy of at least some predetermined reset elements, so that the entropy of the subgroup of reset elements is overall increased.

Furthermore, in accordance with some preferred embodiments of the present invention, the quantum system comprises ensemble of molecules.

Furthermore, in accordance with some preferred embodiments of the present invention, the computation elements are spins.

Furthermore, in accordance with some preferred embodiments of the present invention, the spins are nuclear spins.

Furthermore, in accordance with some preferred embodiments of the present invention, the reset elements are spins.

Furthermore, in accordance with some preferred embodiments of the present invention, the spins are nuclear spins.

Furthermore, in accordance with some preferred embodiments of the present invention, logic gates sequences are used to manipulate the elements.

Furthermore, in accordance with some preferred embodiments of the present invention, the logic gates sequences are NMR pulse sequences.

Furthermore, in accordance with some preferred embodiments of the present invention, the logic gates include CNOT, CSWAP, SWAP and NOT.

Furthermore, in accordance with some preferred embodiments of the present invention, the method is carried out recursively.

Furthermore, in accordance with some preferred embodiments of the present invention, the relaxation time ratio is at least L:1, wherein L is a number greater than 5.

Furthermore, in accordance with some preferred embodiments of the present invention, the relaxation time ratio is manipulated to make it greater.

Furthermore, in accordance with some preferred embodiments of the present invention, the relaxation time ratio is manipulated by adding a relaxation reagent.

Furthermore, in accordance with some preferred embodiments of the present invention, the relaxation reagent is magnetic salt.

Furthermore, in accordance with some preferred embodiments of the present invention, there is provided a method for decreasing entropy of a quantum system of at least two subsystems, a first subsystem comprising elements with a first relaxation time (hereinafter—computation elements) and a second subsystem comprising elements with a second relaxation time (hereinafter—reset elements), the second relaxation time being shorter than the first relaxation time, characterized by a relaxation time ratio defined as the ratio between the relaxation time of the computation elements and the relaxation time of the reset elements, the method comprising:

adiabatically manipulating the entropy of the predetermined elements in the system, by way of entropy compression, entropy transfer or both, so as to decrease the entropy of at least some predetermined computation elements, and to increase the entropy of at least some predetermined reset elements, so that the entropy of the subgroup of reset elements is overall increased;

whereby if a time sufficiently longer than the relaxation time of the reset elements, and sufficiently shorter than the relaxation time of the computation elements is allowed to elapse, the total entropy of the subgroup of reset elements is decreased.

BRIEF DESCRIPTION OF THE DRAWINGS

FIG. 4 shows NMR carbon spectrum of Trichloroethylene (TCE) in thermal equilibrium. The acronym ppm stands for Parts Per Million, so the values written in the horizontal axis should be multiplied by $10^{-6}$: These values are given in relative and non-dimensional units, defined by $\delta=(f-f_{ref})/f_{ref}$, where the various f are resonance frequencies. Here $f_{ref}=$ 100.61345 MHz. Each carbon is represented by a peak that is split once by the C—C interaction and once by the C—H interaction, hence four emission lines for each carbon. On the left side of the spectrum we recognize the lines of C1 in which we see one large splitting due to the strong C—C interaction, and one small splitting due to the weaker C1—H interaction. On the other set of lines we can see that one split is twice as large then the other split. This set of lines is emitted from the C2 carbon. This is caused by the H—C2 interaction that is about twice as strong as the C—C interaction. The perpendicular axis is the signal intensity in arbitrary units. The absolute intensity is irrelevant in NMR. NMR spectroscopists are interested in the change of the spectrum as a result of the experiment, compared to a reference spectrum, like the one in this figure. The polarization of a certain spin is proportional to the area underneath its spectrum.

DETAILED DESCRIPTION OF THE INVENTION AND DRAWINGS

The present invention discloses a novel cooling technique. This new cooling technique opens a wide range of possible applications. We describe herein the cooling of nuclear spins, and it's main application, identifying materials. However, it should be clear that the present invention deals with any usage of algorithmic cooling, not only for cooling nuclear spins, but for cooling other quantum systems comprising particles or any degrees of freedom having discrete or continuous quantum states as well. Spins are only used here as an illustrative example.

Algorithmic cooling, in accordance with the present invention, is a novel cooling technique that is different from any other existing cooling technique: it uses one thermal bath, and two types of particles coupled to this thermal bath: the "regular" particles, some of which we wish to cool, and "reset" particles that are used to pump the heat out of the system. To allow this pumping of heat, entropy manipulation techniques (e.g., adiabatic polarization compression and polarization transfer) are used to attribute the heat onto the reset particles. Then these reset particles lose their heat to the environment very rapidly (it is required that the thermal relaxation time of the reset particles is much smaller than the thermal relaxation time of the regular particles). For simplicity of the explanation we shall refer here only to spin systems in general, and to two-level systems (that is spin-half particles) in particular, to which we refer as "bits" (spin-half particles have two energy levels when subjected to constant magnetic field and these two levels—"0" and "1"—are considered as a bit). However, the results here can be translated also to higher level systems, and apply to these cases as well (to discrete quantum states, and also to continuous quantum states). For two-level systems, e.g., the spin of spin-half particles, the explanation is relatively simple, and we refer to the "regular" spins (some of which are to be cooled) as "computation bits", and we refer to the reset spins as "reset bits". For two-level systems there is a simple one-to-one connection between temperature, entropy, and polarization bias when the system is in thermal equilibrium, as is explained hereinafter, and this makes the analysis (and the explanation) much easier. When a system is shifted away from thermal equilibrium, increasing the polarization bias is equivalent to cooling, or to decreasing the entropy.

Algorithmic cooling in accordance with the present invention is a novel cooling mechanism that is based on combining three very different operations:

1. Adiabatic (reversible) entropy manipulations change the entropy in the subsystem of all computation bits so that some parts (that is, some bits) of the subsystem are cooled while other becomes much hotter than the environment.
2. Controlled interactions (polarization transfer) allow the hotter parts of the system (that is, some predetermined computation bits) to adiabatically lose their entropy to a set of reset bits, while the colder parts of the system are maintained isolated. (These specific hot computation bits become colder because they receive the initial polarization of the reset bits, while the reset bits gain entropy and become hotter in that process).
3. The reset bits rapidly return to their initial conditions and convey their entropy to the environment, while the colder parts (the computation bits) remain isolated, so that the entire system is cooled.

Alternating repeatedly between these operations, and applying these operations recursively results in an algorithm that can cool systems to very cold temperatures.

Steps 1 and 2 can actually be combined into one step of adiabatic entropy manipulations that contains either polarization compression or polarization transfer or both.

Step 1 is well known for many years but, in its most general form, was first described very recently by Schulman and Vazirani ("Molecular Scale Heat Engines and Scalable Quantum Computation", L. J. Schulman and U. Vazirani. Proceedings of the 31'st ACM STOC (Symp. Theory of Computing), 1999, p. 322–329.

The inventors of the present invention are aware of the so called dynamic nuclear polarization (DNP) technique also known as nuclear Overhauser effect (NOE), which is a very special case of using reset bits for polarization transfer, and is used for transferring electron polarization into nuclei. DNP was suggested in order to accomplish polarization transfer, and not to achieve cooling beyond polarization transfer, while the current invention uses reset bits in order to go beyond polarization transfer. Another important difference is that the current invention uses controlled interaction on pre-determine spins while the DNP or NOE perform interaction on all reset and computation spins at once.

However, contrary to DNP, the present invention suggests two novel approaches, which may be used alternatively or combined for cooling systems. In one approach it is suggested to do manipulations of entropy (polarization compression, polarization transfer, or both) to decrease the entropy of some predetermined computation spins in the system, resulting in the reset bits having higher entropy and then waiting (i.e. allowing the reset bits to loose their entropy to the environment) so that the system is cooled. In the other approach of the present invention entropy manipulation (polarization transfer, polarization compression or both) of the system is carried out, resulting in the reset bits acquiring higher entropy, waiting (i.e. allowing the reset bits to loose their entropy to the environment) so that the system is cooled, and carrying a later step of entropy manipulation, but this time it must be controlled, operating on specific predetermined bits of the system.

For example, in NMR, in order to specifically manipulate predetermined spins (bits) or in order to compress specific spins we address the spins using selective electromagnetic pulse sequences, that address differently specific spins (whether reset bits or computation bits)—see examples hereinafter.

The above two approaches can be each or both together be performed recursively.

We first explain why this invention is important, and then we provide a more detailed explanation, and one practical algorithm, plus a way of performing it in practice.

The present invention is a novel technique for effective cooling of spins, useful for improving signal to noise ratio in NMR spectroscopy and similar techniques. The present invention is a much more effective way for cooling spins, relative to the other known cooling techniques. The method of the present invention combines reset bits and reset steps together with polarization compression and polarization transfer to yield a very significant polarization increase. The method of the present invention usually does not replace the other techniques mentioned hereinabove, but rather adds to them, to improve the signal to noise further than possible today. In order to apply the method of the present invention to NMR techniques NMR pulses are used that perform the algorithmic cooling on conventional NMR machines. We present here a few examples of such NMR pulses, but the invention shall cover any set of pulses that performs algorithmic cooling.

In ensemble NMR quantum computing each computer is represented by a single molecule, and the bits of the computer are represented by the nuclear spin-half particles (these are quantum bits or "qubits") embedded on a single molecule. Spin-up state is considered as "0", and spin-down state is considered as "1", and a general state of spin-half particle is some superposition of these two states. A macroscopic number of identical molecules is available in a bulk system, and these molecules act as many computers performing the same computation in parallel. The system is put in a constant magnetic field, so that a small majority of the spins is aligned with the direction of that field. To perform a desired computation, the same sequence of external pulses is applied to all the molecules/computers. Any computation can be done, since single qubit operations and particular two-qubit operations are universal and these can be performed in practice. The density matrix of a particular qubit (particular spin) is calculated by averaging over all computers/molecules. Finally, a measurement of the state of a single qubit is performed by summing over all computers/molecules to read out the output on a particular qubit on all computers.

To define spin's temperature for a spin 1/2 in NMR, consider a spin in a constant magnetic field. At equilibrium with a thermal heat bath the probability of this spin to be up or down (i.e. parallel or anti-parallel to the field's direction) is given by:

$$P_\uparrow = \frac{1+\varepsilon}{2}, \quad P_\downarrow = \frac{1-\varepsilon}{2}.$$

The population bias, $\varepsilon$, is calculated to be:

$$\varepsilon = \tanh\left(\frac{E_\Delta}{2K_B T}\right),$$

where $E_\Delta$ is the energy gap between the up and down states of the spin, $K_B$ is Boltzman's coefficient and T is the temperature of the thermal heat bath. Here we refer to this population bias as the polarization bias of the spins. For high temperatures or small biases we can approximate $$\varepsilon = \frac{E_\Delta}{2K_B T}$$

to leading order. A spin temperature out of equilibrium can be derived to be (again, to leading order):

$$T = \frac{E_\Delta}{2K_B \varepsilon}$$

When taken out of equilibrium the spin goes back to its initial polarization after a typical time called T1, the longitudinal relaxation time. For performing successful algorithmic cooling, the relaxation time of the reset bits must be much smaller than the relaxation time of the regular (computation) bits.

For small values of $\epsilon$, the entropy is given by $1-(\epsilon^2/\ln 4)$. So we see that there is one to one correspondence between decreasing the entropy and increasing the polarization bias, and therefore also with decreasing the temperature.

Hereinafter follows an example of efficient algorithmic cooling, in accordance with the present invention—entropy compression and algorithmic cooling of three bits.

We first present two basic subroutines. The first subroutine, 3-bit-cooling (3BCool) improves the bias of one spin by a factor of approximately 3/2 (for small biases), via adiabatic polarization compression. The second subroutine, 3-bit-algorithmic-cooling (3B-Algo-Cool) adds reset and thermalization to cool the entire system.

Figure 1:
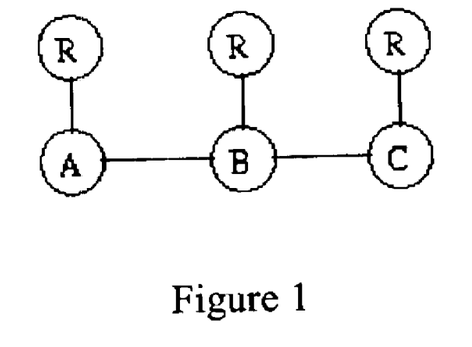
FIG. 1 illustrates an example of a molecule with three computation bits ABC, each is attached to a reset bit. To be used for 3-bit-cooling.

We shall assume here that there is an array of computation bits, and each computation bit has a reset bit with which it can be swapped. Let three computation bits ABC be given, such that each is attached to a reset bit, and all bits has the same bias $\epsilon_0$, (see FIG. 1)). The operation REFRESH(A) means that bit A is swapped with its reset-bit neighbor, in order to retain its reset bias, and the reset bit also retains most of its reset bias after a very short time (its relaxation/thermalization time). The following operation, 3B-Algo-Cool, cools the entire system (the first 2 steps are the 3BCool):

Use bit C as a control, and bit B as a target, and apply a CNOT (Controlled-Not) operation: C→C, B→B⊕C, Where ⊕ denotes a logical exclusive or.

Use bit B as a control, and bits A and C as a target and apply a variant of a CSWAP operation: A→C$\bar{\text{B}}$+AB, B→B, C→A$\bar{\text{B}}$+CB. (A and C swapped if B=0.). (This gate is actually the NOT of CSWAP.)

REFRESH(C), REFRESH(B)

As a result of this algorithm, the bias of A is improved, while the biases of B and C are retained: If B=0 after the CNOT operation, the bias of A after the C-SWAP is $(2\epsilon_0)/(1+\epsilon_0^2)$, and if B=1 the bias of A is still $\epsilon_0$ as it was prior to the operations. [The result $(2\epsilon_0)/(1+\epsilon_0^2)$ is calculated using simple tools of probability theory, namely, conditional probability.] The new bias, $\epsilon_1$, is the weighted average of the two possible biases which is $\epsilon_1=\epsilon_0[1+(1-\epsilon_0^2)/2]$ which gives 3/2 $\epsilon_0$ for small $\epsilon_0$. By waiting a short time, also the reset bits used in the last step retain their original biases and the entire system is cooled down, bypassing Shannon's bound on entropy manipulations in closed systems. This bound was never bypassed before.

The following single operation can replace the CNOT+ CSWAP, performing a 3BCool, to cool bit A (the heated bits BC are not in the same state as for the previous 3BCool, though, but after their REFRESH, the resulting state is exactly the same): input:ABC output:ABC

000→000
001→001
010→010
011→100
100→011
101→101
110→110
111→111

The importance of this observation is that a single 3-bit gate might improve the efficiency of the algorithm (the same is true for 4-bit gate, and a slightly more sophisticated algorithmic cooling).

Note that reset bits can be used for the computing as well, if the computing steps are much faster than the relaxation time of the reset bits. Then the simplest algorithmic cooling can be obtained via 2 computing bits and one reset bit. This new example shall exactly follow the previous one, with C being the reset bit, and REFRESH(C) is performed by waiting for the appropriate relaxation time. The entire process is now: CNOT with C the control and B the target, Then the variant of CSWAP with B the control as previously described, and then REFRESH(C), SWAP between B and C, and again REFERESH(C), in order to reset both B and C to the initial bias.

When the reset bits also have larger polarization bias to start with, we can use a special case of algorithmic cooling that we call "cooling by thermalization" to cool the system in even a simpler way: let's look again on the system composed of 2 computation bits and one reset bit (bit C). It is well known that one can use polarization transfer from C to B in order to cool bit B. We add a REFRESH of bit C, and a few SWAP steps in order to use the rest bit C twice (so that we can use and re-use the reset bit for two polarization transfers). The entire process is: SWAP between B and C, SWAP between A and B, REFRESH(C), SWAP between B and C, REFERESH(C).

Algorithmic cooling can contain also such a reset step for all computation bits to start with, prior to using 3B-Algo-Cool.

Interesting initial experimental results with 3 spins were already obtained. We used 2 carbons as computing bits and one hydrogen as reset bit, to show that Shannon's bound can be bypassed, but we did not perform the full 3B-Algo-Cool yet. To enable two reset operations, we had to increase the ratio of relaxing times of the Hydrogen and Carbon. Adiabatic polarization compression was carried out by a group of scientists in California (D. E. Chang, L. M. K. Vandersypen, M. Steffen 'NMR Implementation of Building Block for Scalable Quantum Computer', Chem. Phys. Lett. 338(4–6) (2001) pp. 337–344) to show that adiabatic compression is possible. It is important to mention that for the experts in NMR quantum computing, performing these algorithms is relatively very easy, and also extending them to more spins (7 and even more) is not difficult.

Hereinafter follows an example for efficient algorithmic cooling to very small biases.

In order to cool one bit (say, bit A) to the second purification level $\epsilon_2$, a small molecule of 5 bits (ABCDE) is sufficient. Start with a parallel reset of bits ABC, followed by a 3BCool that cools bit A to a bias $\epsilon_1$. Repeat the above (reset+3BCool) on bits BCD, and then on bits CDE to obtain bits B and C cooled as well. Finally apply 3BCool to bits ABC to purify bit A to the second purification level $\epsilon_2=\epsilon_1[1+(1-\epsilon_1^2)/2]$. To first order this gives $(3/2)\epsilon_1=(3/2)^2\epsilon_0$.

Based on the same strategy we now present a simple algorithmic cooling which uses 3BCool, and reset steps, to finally lead to highly polarized spins. We assume that we have n computation bits, each attached to a reset bit, and we want to obtain a single bit cooled to the $J_f$ level. The algorithm requires $2 J_f+1$ spins to start with.

The parameter $J_f$ depends on the initial and the final bias. For instance, an increase of the bias from any $\epsilon<<1$ by five times requires $J_f=4$ cooling levels, and 9 spins to start with.

It is important to note that cooling to some relatively small cooling level $\epsilon_{J_f} \approx \epsilon_0 (3/2)^{J_f}$ with, say, $J_f=8$ (17 spins to start with) can already be extremely important in NMR spectroscopy; it provides a bias improved by 25 times, and save repeating a measurement 625 times. Even $J_f=4$ might be sufficient for various applications, in which repeating a measurement 25 times 4 is impossible, or in which repeating does not improve the signal-to-noise ratio (due to the type of noise in the particular process). Note that the time of an experiment that is to be repeated is determined by the relaxing time of the computing spin $T_1$. Even without repetitions, this time is already quite longer than the time of a single experiment that is determined by the dephasing time of the computing spin known as $T_2$ (a time much shorter than the relaxation time.)

To obtain one bit at a purification level j we define the procedure $M_1$, with $M_0$ (the REFRESH)—a SWAP of a bit by a reset bit to yield a single bit at $\epsilon_0$. Then the procedure $M_1$ contains three resets (performed in parallel on three neighboring bits) followed by one 3BCool that cools the left bit (among the three) to level 1. In order to keep track of the locations of the cooled bit we mention the location of the cooled bit. For an array of n bits, $a_n a_{n-1} \ldots a_2 a_1$ we write $M_1(k)$ to say that $M_1$ is applied on the three bits $a_k$; $a_{k-1}$; $a_{k-2}$ so that bit $a_k$ is cooled to a bias level 1. We use the notations $B_{\{(j-1) \to j\}}(k)$ to present the 3BCool purifying bit $a_k$ from $\epsilon_{j-1}$ to $\epsilon$. Then, the full algorithm has a simple recursive form: for $j \in \{1, \ldots, j_F\}$ $$M_j(k) = B_{\{(j-1) \to j\}}(k) M_{j-1}(k) M_{j-1}(k-1) M_{j-1}(k-2)$$

is the recursive formula describing our algorithm, applied from right to left ($M_{j-1}(k-2)$ is applied first). For instance, the algorithm $M_1(3) = B_{\{0 \to 1\}}(3) M_0(3) M_0(2) M_0(1)$ is the 3BCool applied after three reset steps. The procedure cooling 1 bit to the second level (starting with 5 bits) is written as $M_2(5) = B_{\{1 \to 2\}}(5) M_1(5) M_1(4) M_1(3)$. Clearly, if we wish to cool one bit to a bias $J_F$, then $2J_F+1$ bits are required.

Hereinafter are examples for experimental algorithmic cooling.

We present here all the steps of experimental algorithmic cooling with 3 bits. The need for improving the relaxation times ratio between computation bits and reset bits had led to a novel technique. However, all other operations here are probably rather trivial to perform, for any group of experts in NMR quantum computing, or in NMR techniques. Improving the relaxation times ratio is novel, because no one tried to perform it before us (there was no reason to do it prior to the invention of algorithmic cooling). To achieve this we added a magnetic salt that is commonly used to decrease the relaxation time, but was never used to increase the ratio of relaxation times. Other techniques for improving the relaxation times ratio will surely be found in the future when enough experts will know about algorithmic cooling. In order to effectively employ the cooling method of the present invention it is asserted that the relaxation time ratio ought to be at least 1:L, where L is a number greater than 2. In other words, this ratio ought to be sufficiently large, so that the reset bits are close to retain their initial bias before being re-used.

In our experiment, we did not use entropy compression steps, because even the combination of polarization transfer and reset steps, is already sufficient for a complete cooling experiment. This cooling experiment succeeds to bypass Shannon's bound on entropy manipulations because the initial polarization of the reset bits is higher than the initial polarization of the reset bits.

Another group demonstrated that adiabatic polarization compression is experimentally possible. A full algorithmic cooling process was not yet performed, although all its building blocks were demonstrated. Demonstrating it should probably be rather trivial to perform, for any group of experts in NMR quantum computing; these groups perform experiments with up to 7 bits (furthermore, these up to 7-bit experiments suffer from scalability problem that do not exist in our case, so we expect that more bits can be manipulated with existing technology).

Figure 2:
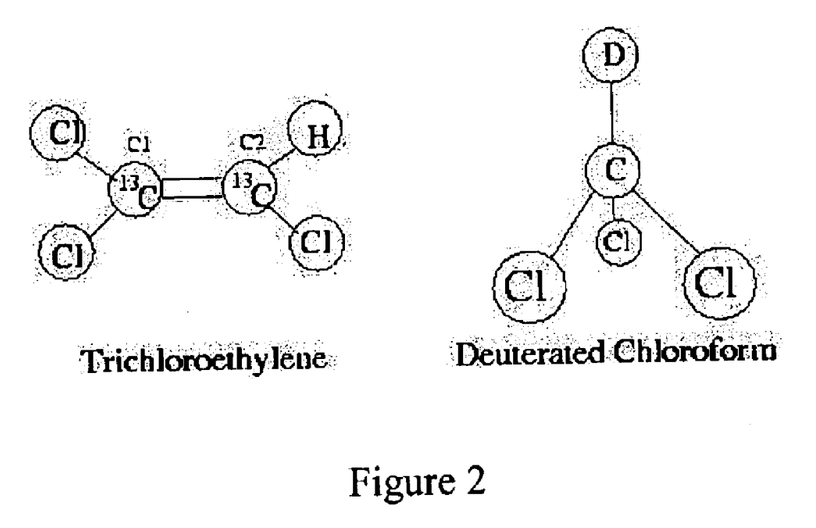
FIG. 2 presents a Tri-chloro-ethylene (TCE) molecule labeled with two $^{13}$C (left) and deuterated chloroform (right). On the left-hand side: TCE has three nuclei with spin ½ that are used as bits, two carbons and hydrogen. The chlorines have very small signals, and their coupling with the carbons can be averaged out so they cannot be considered as bits, and can be ignored here. On the right-hand side: Chloroform-D was the solvent we used for this experiment.

In the experimental example (for a complete cooling experiment) portrayed here the computer is a Tri-Chloro-Ethylane (TCE) molecule labeled by two $^{13}C$, dissolved in deuterated chloroform that can be seen in FIG. 2. We use the Carbons of the type $^{13}C$ as computation bits because these are spin-half particles, and we use the Hydrogen as a reset bit because it is also a spin-half particle, with shorter relaxation time (relaxation time ratio was about 1:5, and by adding the salt we managed to improve it to 8.5 for the Carbon closer to the Hydrogen, and 15 for the Carbon further away from the Hydrogen), and larger polarization bias (4 times larger).

The goal of the first step is to make use of polarization transfer and reset together, in order to initialize the bits to higher polarization, and cool the entire system. As can be seen in the table further bellow presenting the initial and final biases of spins on Trichloroethylene, in the cooling experiment the initial polarization of Hydrogen is four times higher than of the Carbons, and we wish to initiate the system so that for both Carbons, the Carbon's polarization is increased, and in addition, the entire system is cooled. We performed this by transferring polarization from the reset bit to the computational bits in five steps (see FIG. 3 and FIG. 6) using a common NMR pulse sequence—Insensitive Nuclei Enhancement by Polarization Transfer (INEPT). The INEPT pulse sequence is (in some sense) a unidirectional SWAP and for our purpose, it serves us exactly as a regular SWAP, transferring the polarization from the Hydrogen to the Carbon (but we use INEPT because it is easier to implement INEPT than to implement SWAP):

1. INEPT from the proton (hydrogen nucleus) to the neighboring carbon (C2 in FIG. 2)
2. INEPT from this carbon to the next one (C1 in FIG. 2)
3. Waiting for the hydrogen to regain polarization by thermalizing with the environment.
4. INEPT from the proton (hydrogen nucleus) to the neighboring carbon
5. Waiting for the hydrogen to regain polarization by thermalizing with the environment.

Figure 4:
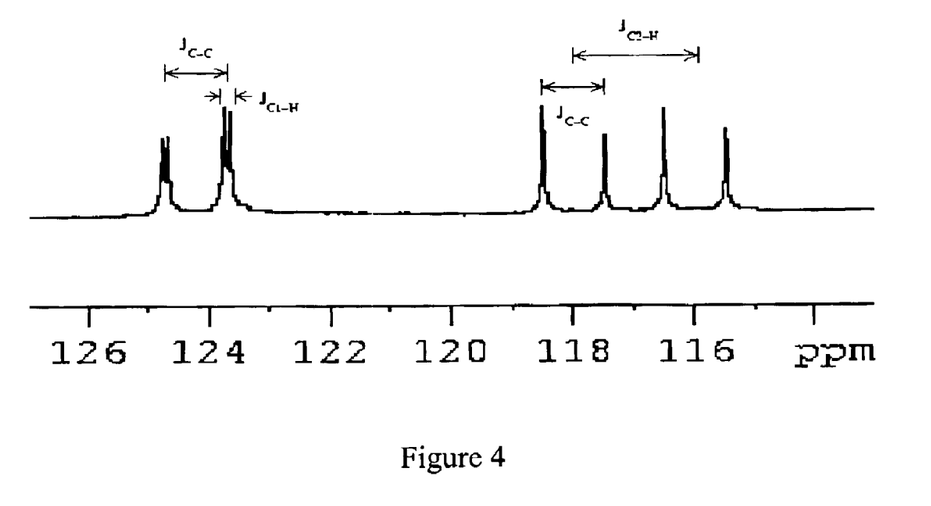
Figure 6:
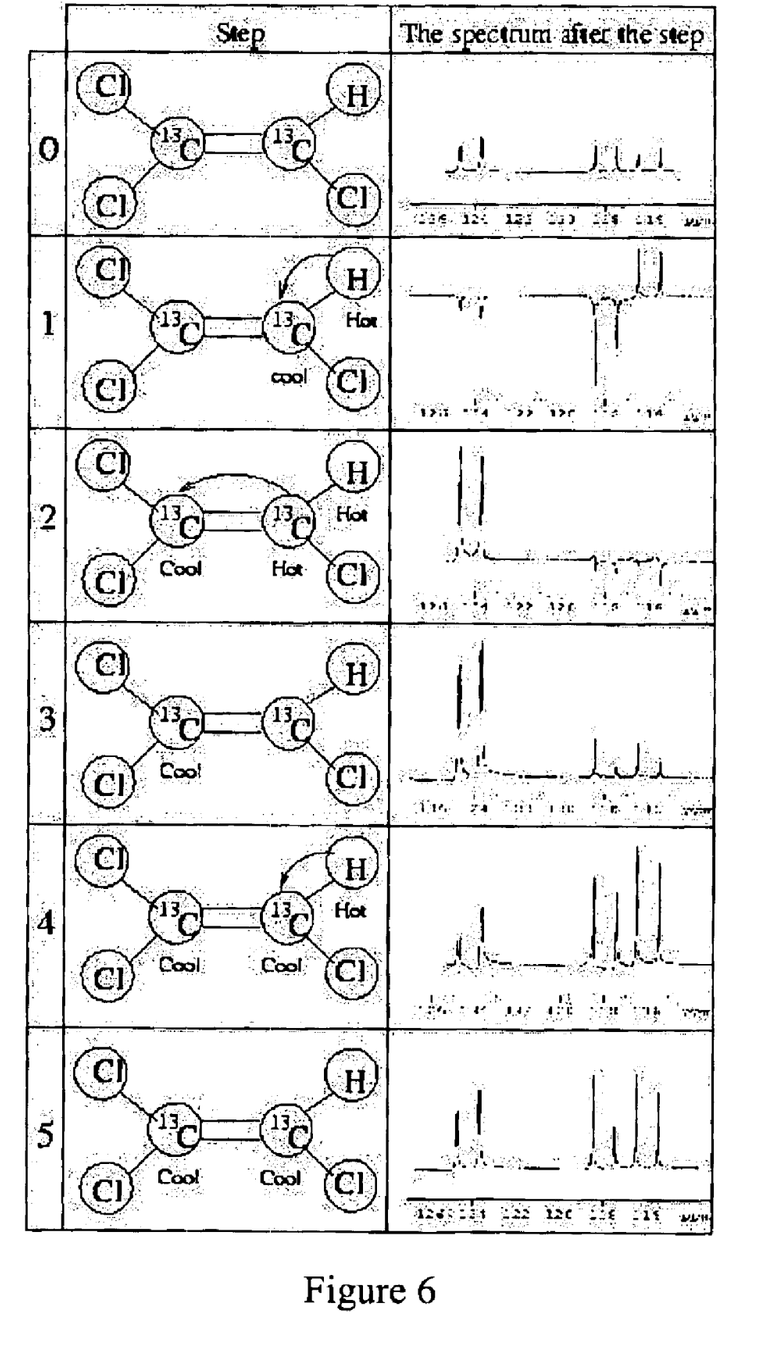
FIG. 6 shows the steps of the cooling procedure and the resulting spectra after every step. The polarization bias ($\epsilon$) of carbon No.1 increased by a factor of 1.944, carbon No.2 increased 2.38 times and the polarization of the proton was calculated to be a factor of $1-e^{-t/T_1}$ In our case t=5 sec and $T_1=1.88$ sec and so this factor is expected to be 0.93, meaning that the proton regained 93% of its equilibrium polarization.

The initial spectrum is presented in FIG. 4 and the spectrum after each step is presented in FIG. 6.

Figure 3:
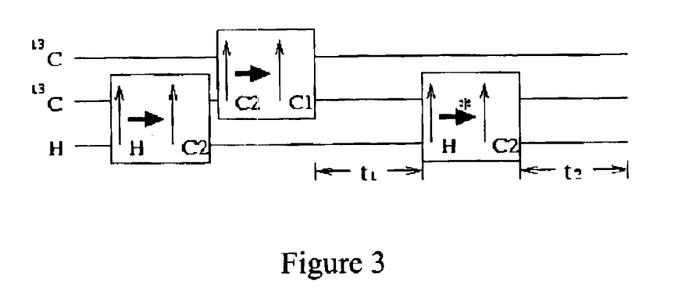
FIG. 3 is a block diagram of a cooling procedure in accordance with a preferred embodiment of the method of the present invention. The arrow boxes denote polarization transfers in the arrow direction. Each polarization transfer sequence is somewhat different from the others. This is due to the need of different refocusing sequences, which compensate for naturally occurring unwanted evolutions. The detailed structures of all the boxes can be found in FIG. 5. The time periods t1 and t2 are the delay times in which we wait for the proton to repolarize (reset).
Figure 5:
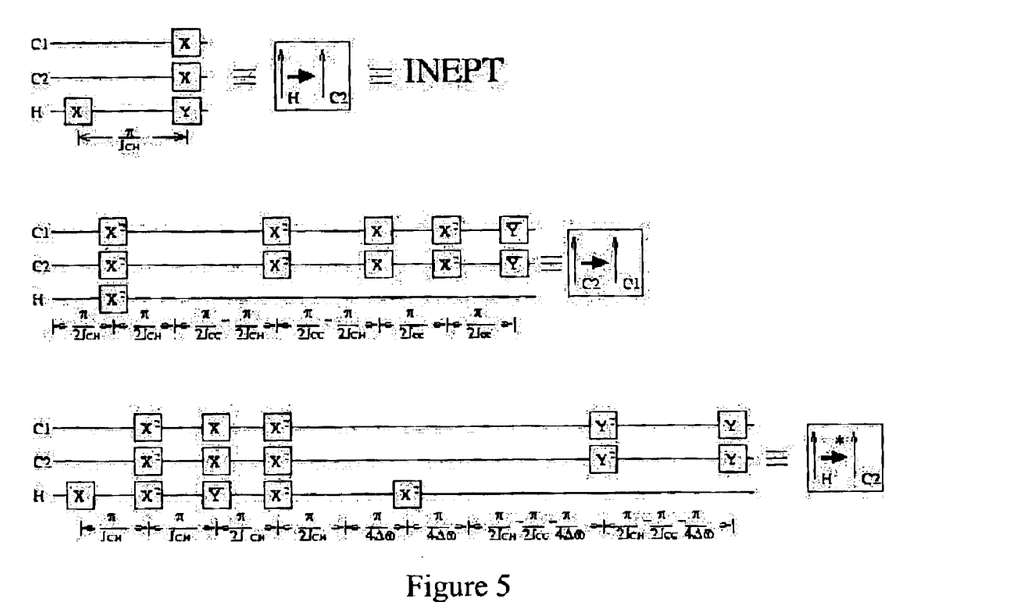
FIG. 5 illustrates details of the pulse sequence which was portrayed in FIG. 3. The letters X, Y denote rotations by an angle of $\pi/2$ round the x or y axis respectively. The superscript 2 denotes a $\pi$ rotation, and a bar (e.g. $\overline{X}$) denotes a $-\pi/2$ rotation. The expression $J_{CC}$ and $J_{CH}$ are the scalar coupling constants between the carbons, and between the hydrogen to C2 respectively. The scalar coupling constants are $J_{CC}=103$ Hz; $J_{CH}=201$ Hz. We have neglected the coupling between the Hydrogen and the more remote Carbon, which is $J_{CH}=8.9$ Hz, in the calculations of this experiment. The letter f is the magnitude of the chemical shift between the carbons. The temporal direction is from left to right.

The structures of the boxes in the block diagram from FIG. 3 are portrayed in FIG. 5. It is important to mention that we use the so-called "hard pulses", namely, pulses that influence both carbons. Compensation steps are used to cancel out undesired transformations (e.g., when we rotate one carbon, we need to cancel out the rotation of the other carbon). Experts in NMR could easily use "soft pulses" that make the design of the pulse sequence much easier. One may wonder why there are two kinds of polarization transfer from the hydrogen to C2. This was done for two reasons:

In the last polarization transfer C1 (the carbon more distant from the proton) has enhanced polarization, we employ certain actions to prevent unwanted polarization transfer out of this carbon. We do not need to take these actions on the first polarization transfer, when C1 was at equilibrium.

We could have performed more complicated sequences that would be implementations of perfect swap gates (up to phases). In that case both polarization transfer sequences would be identical. However these sequences would be much longer, and would contain pulses that cancel each other out (such as a $\pi/2$ pulse followed by a $-\pi/2$ pulse around the same axis), hence we avoided using them.

Every such diagram can be converted to a propagator. We use the notation $$I^i = \frac{1}{2}\vec{\sigma}^i,$$

where $\vec{\sigma}$ are the Pauli matrices that span the representation, in the computational basis, of a state in the 2D Hilbert space (spin 1/2). Defining the operator $$D(t) = e^{i\frac{\pi}{2}[I_z^{C1} - J_{CC}I_z^{C1}I_z^{C2} - J_{CH}I_z^{C2}I_z^{H}]t},$$

as the evolution operator of the system during a time period with no applied pulses, the propagator of the polarization transfer from one carbon to the other is the next:

$$[\uparrow_{C2} \Rightarrow \uparrow_{C1}] = D\left(\frac{1}{J_{CH}}\right)e^{i\pi(I_x^{C1} + I_x^{C2} + I_x^H)}D\left(\frac{1}{J_{CH}}\right)D\left(\frac{1}{J_{CC}} - \frac{1}{J_{CH}}\right) \times$$
$$e^{i\pi(I_x^{C1} + I_x^{C2})}D\left(\frac{1}{J_{CC}} - \frac{1}{J_{CH}}\right)e^{-i\frac{\pi}{2}(I_x^{C1} + I_x^{C2})} \times$$
$$D\left(\frac{1}{J_{CC}}\right)e^{i\pi(I_x^{C1} + I_x^{C2})}D\left(\frac{1}{J_{CC}}\right)e^{i\frac{\pi}{2}(I_x^{C1} + I_x^{C2})}$$

The following table presents the initial and final biases of spins on Trichloroethylene, in the cooling experiment.

| Label | Initial bias | Final bias (Exp.) | Final bias (Calc.) |
|---|---|---|---|
| C1 | $\epsilon_0$ | $1.944\epsilon_0$ | $3.14\epsilon_0$ |
| C2 | $\epsilon_0$ | $2.38\epsilon_0$ | $3\epsilon_0$ |
| H | $4\epsilon_0$ | Not measured | $3.72\epsilon_0$ |

Let us now explain how the successful cooling can be read (and concluded) from the spectrum we see in FIG. 6. The relevant measure is not the absolute values of the bias, but rather the change in bias due to the experiment relative to the initial spectrum shown in FIG. 4 and in FIG. 6 in step zero. The area under the spectrum of each spin was taken as its relative bias. In FIG. 6 we see the final results of the cooling experiment, and all the intermediate steps as well. The polarization bias is doubled (more or less). Note that this first (and very successful) experiment still did not yield the biases expected in theory. We believe that the significant difference between calculated and measured biases is due to effective coherence loss through inhomogeneity of the sample, also known as $T_2^*$ mechanism. $T_2^*$ being the effective decoherence time.

Hereinafter is presented an experiment demonstrating 3 Bit Cooling.

The goal of this step is to adiabatically compress the bits and yield a single bit with a higher polarization than it had before the compression. This is done by employing the two logic gates CNOT and CSWAP, indicated hereinabove as 3BCool. This step was experimentally performed by another group (D. E. Chang, L. M. K. Vandersypen, M. Steffen 'NMR Implementation of Building Block for Scalable Quantum Computer', Chem. Phys. Lett. 338(4–6) (2001) pp. 337–344), that implemented the Schulman-Vazirani entropy compression. Note that without the reset steps (that we added in algorithmic cooling), a simple cooling technique based on 3BCool alone shall require 81 bits to reach the same cooling that algorithmic cooling can reach with 9 bits.

Let us briefly describe the experiment performed by D. E. Chang, L. M. K. Vandersypen and M. Steffen. A 2 mol % solution of $C_2F_3Br$ in deuterated acetone was used as the homonuclear three-spin system, for its remarkable spectral properties: strong chemical shifts (0, 28.2, and 48.1 ppm, arbitrarily referenced) and large scalar couplings ($J_{ab}$=−122.1 Hz, $J_{ac}$=75.0 Hz, and $J_{bc}$=53.8 Hz) combined with long relaxation times ($T_1$'s ≈4–8 s). The experiments were conducted at 30° C. and 11.7 Tesla, on a Varian$^{UNITY}$ INOVA spectrometer.

Figure 7:
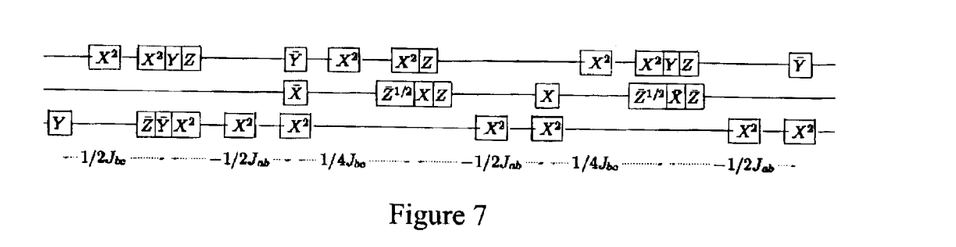
FIG. 7 illustrates a pulse sequence to implement entropy compression. X, Y, and Z represent 90° rotations about those respective axes. $\overline{X}$ represents a negative 90° rotation, $X^2$ denotes a 180° rotation and $X^{1/2}$ denotes a 45° rotation. This pulse sequence is designed for molecules with $J_{ab}<0$ and $J_{ac}$; $J_{bc}>0$.
Figure 8:
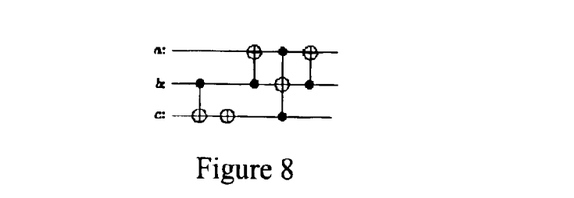
FIG. 8 illustrates a quantum circuit that implements entropy compression. Horizontal lines represent the qubits and the qubit's states are transformed by circuit elements representing unitary operations. The $\oplus$ symbol indicates a controlled bit flip. The • symbol denotes a control bit. The operation it controls is performed if and only if the control bit is in the state "1". The controlled-swap operation has been replaced by an equivalent set of gates: two CNOT's and a Toffoli gate.

All pulses were spin-selective, see FIG. 7, and varied in duration from 1 to 3 msec. Hermite 180° and av90° shaped pulses were employed for 180° and 90° rotations respectively, in order to minimize the effect of the J couplings between the selected and non-selected spins during the pulses. Couplings between the unselected spins are irrelevant whenever those spins are along $\pm \hat{z}$. Bloch-Siegert shifts were accounted for in the pulse sequence out of necessity: they result in an extra phase acquired by the non-selected spins in their respective on-resonance reference frames. These phase shifts are in some cases more than 90° per pulse, while even phase shifts on the order of 5° are unacceptable. For simplicity, Bloch-Siegert corrections and other $\hat{z}$ rotations were implicitly performed by changing the phase of subsequent RF pulses. The duration of the entire sequence of FIG. 8 is about 70 msec, for the implementation shown in FIG. 7.

The prediction is that the entropy compression increases the signal of spin a averaged over the four spectral lines by a factor of 3/2, equal to the bound for polarization enhancement established hereinabove.

Figure 9:
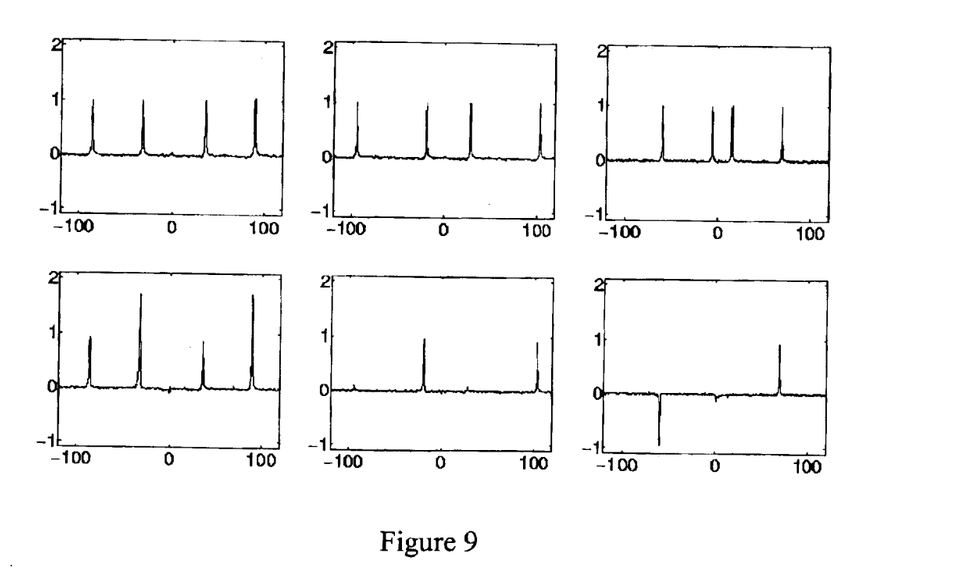
FIG. 9 shows experimentally measured spectra of spin a (Left), spin b (Center) and spin c (Right), after a readout pulse on the corresponding spin, for the spin system in thermal equilibrium (Top) and after applying entropy compression (Bottom). The real part of the spectra is shown, and the spectra were rescaled in order to obtain unit amplitude for the thermal equilibrium spectra. Frequencies are in Hz with respect to the Larmor frequency of the respective spins.

The experimentally measured spectra before and after the entropy compression are shown in FIG. 9. Clearly, the signal of spin a has increased on average as a result of the entropy compression, and the relative amplitudes of the four lines are in excellent agreement with the theoretical predictions. The measured areas under the four peaks combined before and after polarization transfer have a ratio of 1.255±0.002. The spectra of spins b and c after the boosting procedure are also in excellent agreement with the theoretical predictions, up to a small overall reduction in the signal strength. The experimentally measured $\text{Tr}(\rho_f I_z^a)/\text{Tr}(\rho_i I_z^a)$ gives a polarization enhancement factor of 1.235±0.016, consistent with the enhancement obtained just from the peak integrals of spin a. The experimental implementation of the entropy compression thus successfully increased the polarization of spin a.

Despite the excellent qualitative agreement between the measured and predicted data, the quantitative polarization enhancement of spin a is lower than ideally achievable. Given the absence of substantial coherences, this suboptimal enhancement was attributed by D. E. Chang, L. M. K. Vandersypen and M. Steffen primarily to signal attenuation due to RF field inhomogeneity and, to a lesser extent, due to transverse relaxation. The minor excitation of coherences is attributed mostly to incomplete removal of undesired coupled evolution during the RF pulses.

We claim:

1. A method for decreasing entropy of a quantum system of at least two subsystems, a first subsystem comprising computation elements which are elements with a first relaxation time and a second subsystem comprising reset elements which are elements with a second relaxation time, the second relaxation time being shorter than the first relaxation time, characterized by a relaxation time ratio defined as the ratio between the relaxation time of the computation elements and the relaxation time of the reset elements, the method comprising:

adiabatically manipulating the entropy of the elements in the system, by way of entropy compression, entropy transfer or both, so as to decrease the entropy of at least some computation elements, and to increase the entropy of at least some reset elements, so that the entropy of the subgroup of reset elements is overall increased; and waiting for a time sufficiently longer than the relaxation time of the reset elements, and sufficiently shorter than the relaxation time of the computation elements for the total entropy of the subgroup of reset elements to decrease, wherein the step of adiabatically manipulating the entropy of the elements in the system and the step of waiting are carried out at least once, and wherein in at least one occurrence of the step of adiabatically manipulating the entropy, adiabatic manipulation is carried out on predetermined elements in the system, by way of entropy compression, entropy transfer or both, so as to decrease the entropy of at least some predetermined computation elements, and to increase the entropy of at least some predetermined reset elements, so that the entropy of the subgroup of reset elements is overall increased.

2. The method of claim 1, wherein the quantum system comprises an ensemble of molecules.

3. The method of claim 1, wherein the computation elements are spins.

4. The method of claim 3, wherein the spins are nuclear spins.

5. The method of claim 1, wherein the reset elements are spins.

6. The method of claim 5, wherein the spins are nuclear spins.

7. The method of claim 1, wherein logic gates sequences are used to manipulate the elements.

8. The method of claim 7, wherein the logic gates sequences are NMR pulse sequences.

9. The method of claim 7, wherein the logic gates include CNOT, CSWAP, SWAP and NOT.

10. The method of claim 1, wherein the method is carried out recursively.

11. The method of claim 1, wherein the relaxation time ratio is at least L:1, wherein L is a number greater than 5.

12. The method of claim 1, wherein the relaxation time ratio is manipulated to make it greater.

13. The method of claim 12, wherein the relaxation time ratio is manipulated by adding a relaxation reagent.

14. The method of claim 13, wherein the relaxation reagent is magnetic salt.

* * * * *